(12) United States Patent
Colbert et al.

(10) Patent No.: US 6,802,733 B2
(45) Date of Patent: Oct. 12, 2004

(54) TOPSIDE INSTALLATION APPARATUS FOR LAND GRID ARRAY MODULES

(75) Inventors: John L. Colbert, Byron, MN (US);
John S. Corbin, Jr., Austin, TX (US);
Roger D. Hamilton, Eyota, MN (US);
Danny E. Massey, Austin, TX (US);
Arvind K. Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 09/931,299

(22) Filed: Aug. 16, 2001

(65) Prior Publication Data

US 2003/0036301 A1 Feb. 20, 2003

(51) Int. Cl.[7] .............................................. H01R 13/62
(52) U.S. Cl. .................................................... 439/331
(58) Field of Search ........................... 439/70, 71, 331, 439/72, 73

(56) References Cited

U.S. PATENT DOCUMENTS 5,730,620 A * 3/1998 Chan et al. ................. 439/526
5,793,618 A * 8/1998 Chan et al. ................. 361/809
5,919,050 A * 7/1999 Kehley et al. ................ 439/71
5,997,316 A * 12/1999 Kunzel ........................ 439/73
6,181,567 B1 * 1/2001 Roemer et al. ............. 361/760

* cited by examiner

Primary Examiner—Tulsidas Patel
(74) Attorney, Agent, or Firm—Casimer K. Salys; Cardinal Law Group

(57) ABSTRACT

An installation apparatus and method for actuating the electrical connection of a land grid array module to a printed wiring board is provided. A backside stiffener with load posts is attached to a printed wiring board. A load plate, module, plurality of load columns, and springplate are operably connected to the load posts. An actuation screw operably connected to the springplate is rotated imparting an actuation force to the module. The backside stiffener includes a local stiffener, wherein the local stiffener causes a deflection in the printed wiring board complementary to the deflection of the module when the actuation force is applied.

15 Claims, 4 Drawing Sheets

TOPSIDE INSTALLATION APPARATUS FOR LAND GRID ARRAY MODULES

TECHNICAL FIELD OF THE INVENTION

In general, the invention relates to the installation of a land grid array module to a printed wiring board.

BACKGROUND OF THE INVENTION

Area array socket connectors are an evolving technology in which an electrical interconnection between mating surfaces is provided through a conductive interposer. One significant application of this technology is the socketing of land grid array modules directly to a printed wiring board, in which the electrical connection is achieved by aligning the contact array of the two mating surfaces and the interposer, then mechanically compressing the interposer. Land grid array sockets assemblies are prevalent today in the electronics industry to attach single-chip-modules to printed wiring boards.

One method of generating the force required to compress the interposer is to deflect a springplate connected to the module. One example of a land grid array socket assembly using this technique is shown in FIG. 1. In this example, a flat rigid backside stiffener 152 with attached load posts 138 is attached to a printed wiring board 144. A module 134 with attached land grid array interposer 136 and heatsink 130 is slid over the load posts 138. The load transfer sleeves 128 are slid over the load posts 138 and contact the heatsink 130. A load transfer plate 122 is placed over the load posts 138 and rests on the load transfer sleeves 128. A springplate 116 is then attached to the top end of the load post 138. An actuation screw 112 inserted in the springplate 116 is then tightened until a slight compressive force is exerted on the load transfer sleeves 128. The actuation screw 112 is then rotated a predetermined number of turns displacing the springplate 116 from the load transfer plate 122. The springplate 116 deflects as it is displaced, resulting in a tensile force being applied to the load posts 138. The load plate 122 distributes the compressive load in the screw 112 to the load transfer sleeves 128. The compressive force in the sleeves 128 forces the heatsink 130 and module 134 towards the printed wiring board 144 compressing the interposer 136 establishing electrical connection between the module 134 and printed wiring board 144.

One problem with this type of connection system is that determining when a slight compressive force is exerted on the load transfer sleeves is very subjective. If the installer does not accurately determine when a slight compressive force is exerted in the load sleeves, the displacement of the load plate from the springplate will be inaccurate causing an incorrect actuation force to be applied. If excessive actuation force is applied, components in the assembly may be damaged. If to little actuation force is applied, a good electrical connection between the module and printed wiring board may not be established.

The surface of the land grid array module that contacts the interposer has a plurality of electrical contact points that align with contact points on the printed wiring board. Each of the contact points on the module must compress the interposer in order to make electrical connection with the contacts on the printed wiring board. If the contact points do not compress the interposer equally, some electrical connections between the contacts on the module and printed wiring board will be better than others. Unequal electrical connections may cause the electrical circuits within the module to operate improperly. One reason for unequal compression of the interposer may be that the load sleeves are not of equal length. If the load sleeves are not of equal length, the longer sleeves will transmit more of the load from the load plate. Load sleeves with a higher load will compress the interposer more than load sleeves with a lesser load. Another cause for unequal compression of the interposer is that the actuation force is applied to the edges of the module. When the actuation force is applied and the interposer is compressed, the interposer imparts a reactive load on the module. Since the actuation force and the reactive force are exerted in different areas of the module, a torque on the module results. The torque on the module may cause the module to deflect away from the interposer. If the module deflects, the distance from the edge of the module to the board may be less than the distance from the center of the module to the board resulting in the interposer compressing more near the edge of the module.

What is therefore needed is a method and apparatus for installing land grid array modules that will provide a fixed and uniform actuation force to the module independent of component manufacturing tolerances and module deflection.

SUMMARY OF THE INVENTION

One aspect of the invention provides a method of actuating the electrical connection of a land grid array module to a printed wiring board. A topside actuation force is exerted between a load plate and a springplate. The actuation force is translated to a plurality of load columns operably connected to load posts, whereby electrically connecting the land grid array module to a printed wiring board. The load plate may comprise a springplate.

Another aspect of the invention provides a method of actuating the electrical connection of a land grid array module to a printed wiring board. A land grid array module is deflected and the printed wiring board is deflected complementary to the deflection of the module.

Another aspect of the invention provides an apparatus for actuating the electrical connection of a land grid array module to a printed wiring board utilizing a plurality of load posts, a first springplate operably connected to the load posts, a plurality of load columns, and a second springplate operably connected to the load columns. An actuation member is operably connected to the springplates, wherein a force resulting from the actuation member is distributed to the load columns to operably connect the land grid array module to the printed wiring board. The springplates comprise laminated material. The actuation member is a screw. A stop is included in the screw to limit the actuation force imparted on the springplate. The actuation member is centrally located on the spring plates. The load columns are slideably received onto load posts. A backside stiffener is operably attached to the load posts. The backside stiffener includes a local stiffener operably located on the backside stiffener.

Another aspect of the invention provides an apparatus for actuating the electrical connection of a land grid array module to a printed wiring board utilizing a plurality of load posts, a load plate operably connected to the load posts, a plurality of load columns, and a springplate operably connected to the load columns. An actuation screw is operably connected to the springplate, wherein a force resulting from the actuation screw is distributed to the load columns to operably connect the land grid array module to the printed wiring board. The springplate comprise laminated material. The load plate comprises a springplate. The screw includes a stop to limit the actuation force imparted on the springplate. The stop comprises a shoulder formed on the screw. The actuation screw is centrally located on the springplate. The load columns are slideably received onto load posts. A backside stiffener operably attached to the load posts. The backside stiffener includes a local stiffener operably located on the backside stiffener.

Another aspect of the invention provides an apparatus for actuating the electrical connection of a land grid array module to a printed wiring board utilizing an actuation assembly and a backside stiffener. The backside stiffener may include a local stiffener. The local stiffener causes a deflection in the printed wiring board complementary to the deflection of the module when the actuation force is applied. The local stiffener is positioned in a pocket included in the backside stiffener. The local stiffener contacts a pedestal formed in the pocket.

DETAILED DESCRIPTION OF THE PRESENTLY PREFERRED EMBODIMENTS

Figure 1:
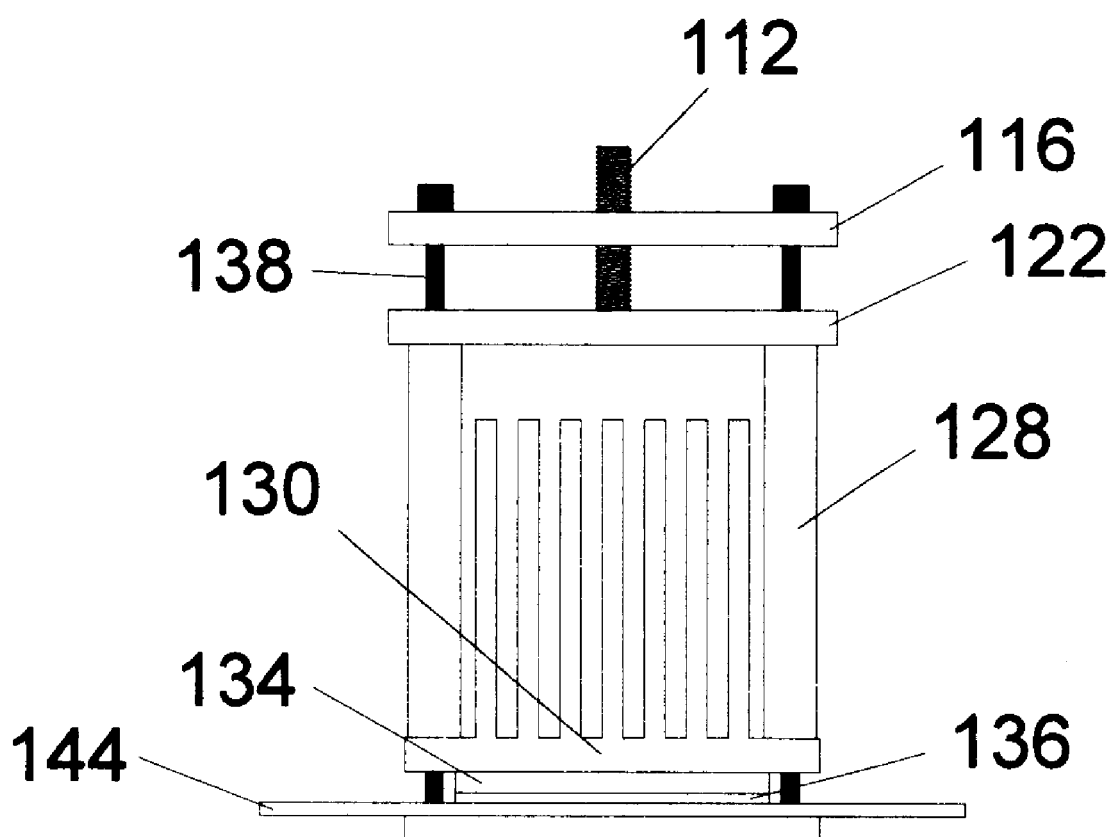
FIG. 1 is a perspective view of a prior art actuation apparatus for a land grid array module.
Figure 2:
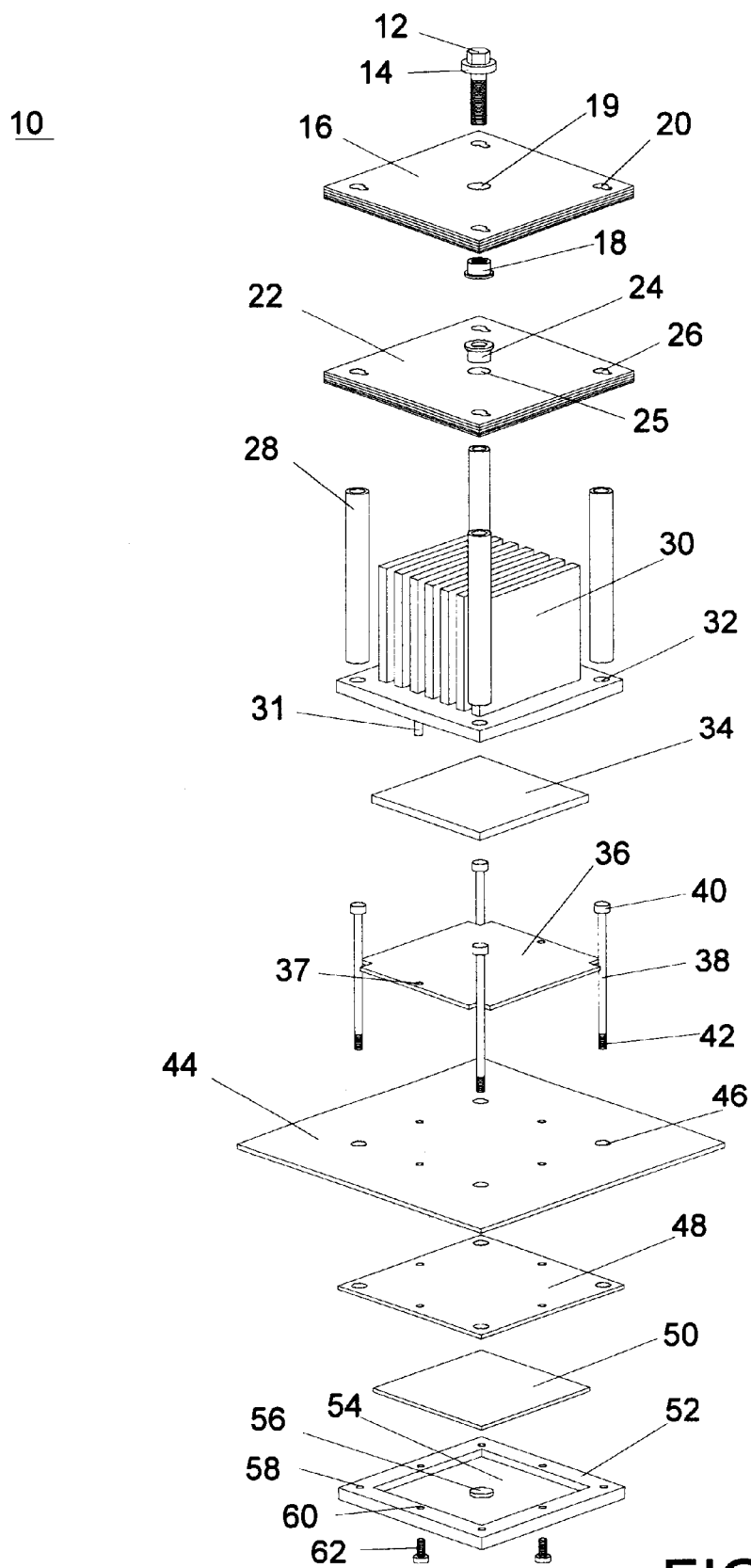
FIG. 2 is an exploded perspective view of one embodiment of an apparatus for actuating the electrical connection of a land grid array module to a printed wiring board.
Figure 3:
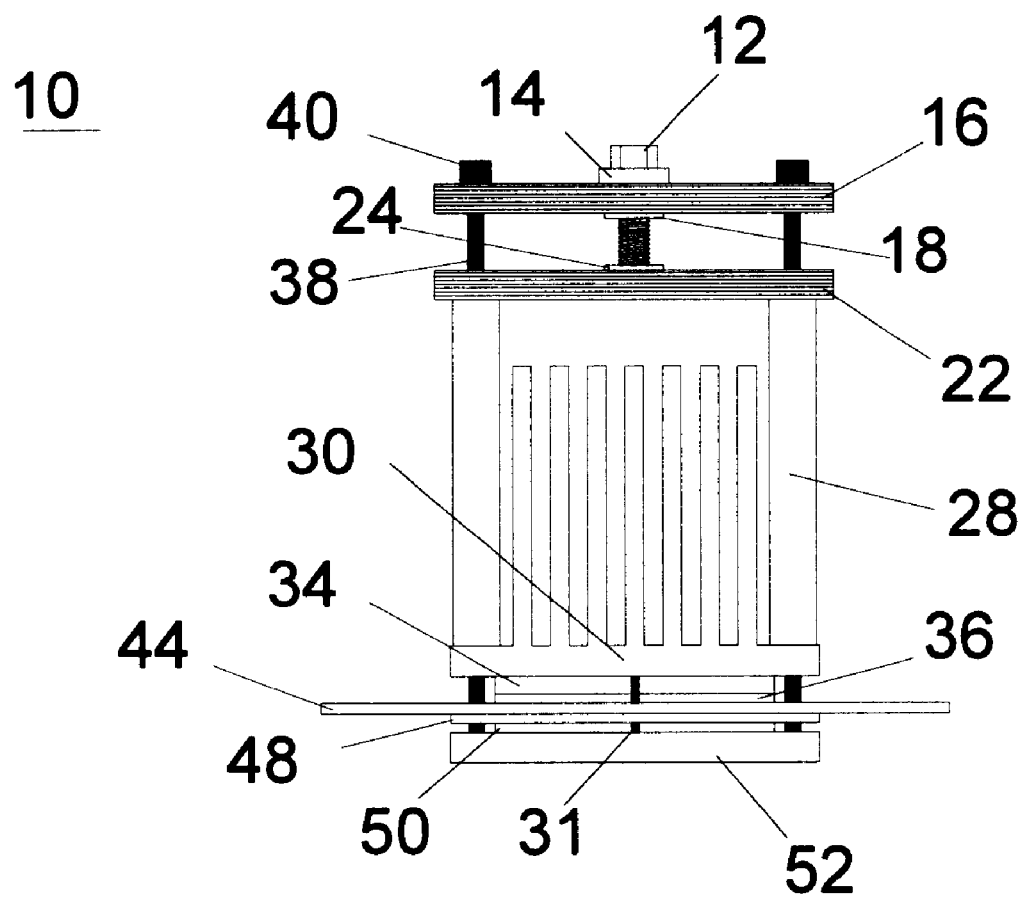
FIG. 3 is a perspective view of one embodiment of an apparatus for actuating the electrical connection of a land grid array module to a printed wiring board.

One embodiment of an installation apparatus for land grid array modules is illustrated in FIGS. 2 and 3 designated in the aggregate as numeral 10. The apparatus 10 can include a include a plurality of load posts 38, load plate 16, plurality of load columns 28, springplate 22, actuation member 12, and a backside stiffener 52 including a local stiffener 50. The local stiffener 50 may cause a deflection in the printed wiring board 44 complementary to the deflection of the module 34 when the actuation force is applied. The installation apparatus may provide a limited and uniform actuation force to the module independent of component manufacturing tolerances and module deflection.

Load posts 38 may provide structural support of the actuation assembly. In one embodiment, the load posts may have a threaded portion 42 to allow fastening the post to the backside stiffener 52. The load post 38 may include a shoulder 40 sized to engage keyhole slots 20 in the load plate 16.

The load plate 16 can distribute the force generated by the actuation member 12 to the load posts 38. In one embodiment, the load plate 16 may include a plurality of keyhole slots 20 sized to capture the shoulder 40 on the load post 38. The load plate 16 may include a threaded bushing 18 to accept an actuation screw 12. The threaded bushing 18 may be pressed into a hole 19 in the load plate 16. The threaded bushing 18 may be centrally located to allow even load distribution to the load posts 38. The load plate 16 may comprise a rigid material. In another embodiment, the load plate 16 may comprise a laminated compliant springplate. Those skilled in the art will recognize that a compliant load plate may allow for more even load distribution and tighter control of the actuation force than a rigid load plate.

The load columns 28 may transmit the actuation force from the spring plate 22 to the module assembly 34. In one embodiment, the load columns 28 may be tubular in shape. The inside diameter may be sized so that the load post 38 may pass through the column 28.

The springplate 22 may distribute the force generated by the actuation member 12 to the load columns 28. In one embodiment, the springplate 22 may comprise a laminated compliant material. The springplate 22 may include a plurality of holes 26 sized to allow the shoulder 40 on the load post 38 to pass through. The springplate 22 may include a thrust bearing 24. The thrust bearing 24 may be pressed into a hole 25 in the springplate 22. When the actuation screw 12 is rotated, the screw 12 may push against the thrust bearing 24. The thrust bearing 24 may act as a centering device keeping the screw 12 centrally located on the spring plate 22. The thrust bearing 24 can be centrally located on the springplate 22 to allow even load distribution to the load columns 28. Those skilled in the art will recognize that the use of a laminated springplate may optimize the balance between achievable load control and stress developed in the laminate due to actuation.

An actuation member 12 may impart an actuation force on the springplate 22. In one embodiment, the actuation member 12 may be a screw. The actuation screw may include a stop 14. The stop 14 may comprise a shoulder 14 formed on the screw 12. The length of the screw 12 may be selected so that when the screw shoulder 14 contacts the load plate 16 the desired springplate 22 deflection results.

Figure 4:
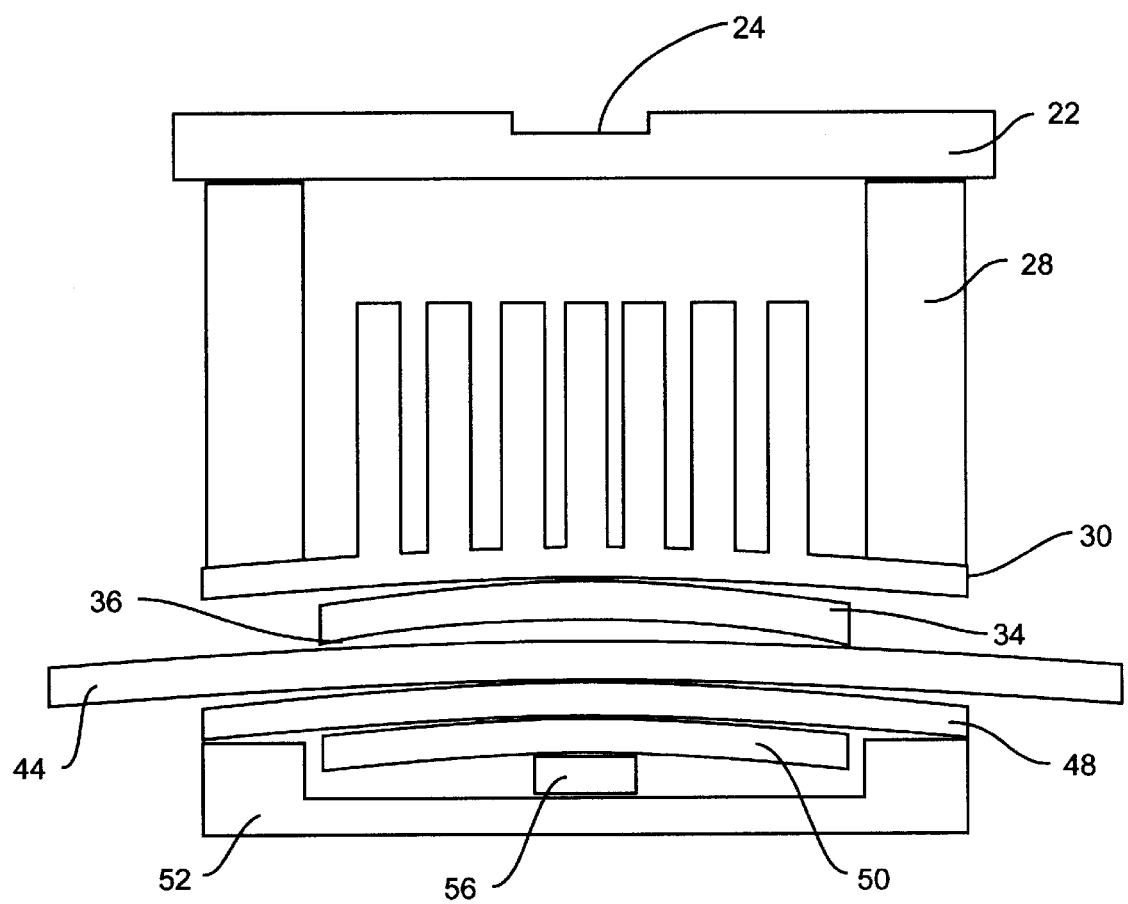
FIG. 4 is a cross-section view of one embodiment of an apparatus for actuating the electrical connection of a land grid array module to a printed wiring board, showing deflection of the printed wiring board complementary to a deflection of the LGA module.

A backside stiffener 52 may structurally support the printed wiring board 44 and load posts 38. In one embodiment, the backside stiffener 52 may include a plurality of threaded holes 58 to receive load posts 38. The backside stiffener 52 may include a plurality of mounting holes 60 to facilitate attaching the stiffener 52 to a printed wiring board 44. The backside stiffener 52 may include a local stiffener 50 to cause a deflection in the printed wiring board 44 complementary to the deflection of the module 34 when the actuation force is applied. The local stiffener 50 may be received within a pocket 54 formed in the stiffener 52. The pocket 54 may include a pedestal 56 formed in the pocket 54. The pedestal 56 may be centrally located in the pocket 54. The size of the pedestal 56 and local stiffener 50 may be selected to deflect the printed wiring board 44 complementary to the deflection of the land grid array module 34 when the actuation force is exerted. See FIG. 4.

A backside stiffener 52 with attached load posts 38 may be attached to a printed wiring board 44. A land grid array module 34 and the remaining actuation assembly may be installed onto the load posts 38. Actuating the actuation member 12 may establish electrical connection between the land grid array module 34 and printed wiring board 44. In one embodiment, a plurality of load posts 38 may be fastened to the backside stiffener 52. A local stiffener 50 may be placed within the pocket 54 formed in the backside stiffener 52. An insulating sheet 48 can be installed between the backside stiffener 52 and the printed wiring board 44. The backside stiffener 52 can be positioned on the printed wiring board 44 by passing the load posts 38 through corresponding holes 46 in the printed wiring board 44. Fasteners 62 including, for example, screws, rivets, and clips may be used to secure the backside stiffener 52 to the printed wiring board 44. A heat sink 30 may be attached to a module 34. A land grid array interposer 36 may be attached to the electrical contact surface of the module 34. The module 34 with attached heatsink 30 and land grid array interposer 36 may be positioned on the printed wiring board 44 by aligning the load posts 38 with corresponding holes 32 in the heatsink 30 and sliding the assembly toward the board 44. The base of the heatsink 30 may include dowel pins 31, which are received in holes 37 in the interposer 36, and engaged in holes in the printed wiring board 44. The dowel pins 31 may allow for fine alignment of the module 34, interposer 36, and printed wiring board 44. The load columns 28 may be slid over the load posts 38. The springplate 22 may be positioned on the load posts 38 by aligning the posts 38 with the corresponding holes 26 in the springplate 22 and sliding the springplate 22 over the posts 38. The load plate 16 may be positioned on the load posts 38 by aligning the posts 38 with the corresponding keyhole slots 20 in the load plate 16 and sliding the load plate 16 over the posts 38. In one embodiment, after the load plate 16 is past the shoulder 40 on the load posts 38, the load plate 16 may be moved laterally to secure the load plate 16 in position. The actuation screw 12 may be installed into the threaded bushing 18 on the load plate 16. As the actuation screw 12 is inserted, the screw 12 contacts the thrust bearing 18 in the springplate 16 preventing the screw 12 from becoming misaligned. The screw 12 may be tightened until the stop 14 on the screw 12 contacts the load plate 16. When the stop 14 contacts the load plate 16, the center of the spring plate 22 and load plate 16 may be displaced a fixed distance. Displacing the load plate 16 from the springplate 22 may cause a compressive load to develop in the actuation screw 12. The load plate 16 may distribute the compressive load in the screw 12 to the load posts 38 causing a tensile force in the posts 38. The springplate 22 may distribute the load in the screw 12 causing compressive force in the columns 28. The compressive force in the columns can force the heatsink 30 and module 34 toward the printed wiring board 44. Forcing the module 34 toward the printed wiring board 44 compresses the interposer 36 and establishes electrical connection between the electrical contacts on the land grid array 34 and the printed wiring board 44. The compression of the interposer 36 by forces on the edge of the module 34 normally would cause a deflection in the central regions of the module 34 and printed wiring board 44 away from the interposer 36. The tensile force in the load posts 38 may force the backside stiffener 52 toward the printed wiring board 44. The local stiffener 50 included in the backside stiffener 52 may deflect the printed wiring board 44 complementary to the deflection of the module 34. Matching the deflection of the module 34 and the printed wiring board 44 may provide equal compression of the interposer 36. Equal compression of the interposer 36 may provide uniform electrical connections between the module 34 and the printed wiring board 44.

While the embodiments of the invention disclosed herein are presently considered to be preferred, various changes and modifications can be made without departing them the spirit and scope of the invention. The scope of the invention is indicated in the appended claims, and all changes that come within the meaning and range of equivalents are intended to be embraced therein.

What is claimed is:

1. A method of actuating an electrical connection of a land grid array module to a printed wiring board (PWB), the method comprising:

providing an actuation apparatus including a plurality of load posts connected to a backside stiffener situated below the printed wiring board, a first springplate operably connected to the load posts, the first springplate having a hole, a plurality of load columns connected to a heatsink situated above the land grid array module, a second springplate operably connected to the load columns, and a screw extending through the hole and operably connected to the first and second springplates for applying an actuation force to separate the first and second springplates a predefined distance, the screw including a stop to limit the actuation force imparted on the springplates, whereby a force resulting from operation of the actuation member is distributed to the load columns to move the heat sink downward toward the land grid array module, to move the backside stiffener upwards toward the printed wiring board, and to operably connect the land grid array module to the printed wiring board;

attaching the module to the PWB with the actuation device, and limiting rotation of the screw with the stop.

2. The method of claim 1 further comprising forming at least one of the first and second springplates from a laminated material.

3. The method of claim 1 wherein:

the PWB includes a front side and a backside thereof;

actuating the actuation apparatus causes a deflection of the module;

the actuation apparatus further comprises a backside stiffener operatively connected for applying force received the load posts to the backside of the PWB;

the backside stiffener includes a pocket with a pedestal formed in the pocket, and a local stiffener positioned in the pocket between the pedestal and the backside of the PWB;

the local stiffener operatively bears against the backside of the PWB for causing a deflection in the PWB complementary to the deflection in the module when actuation force is applied by the actuation apparatus; and the method further comprises applying an actuation force with the actuation apparatus, to thereby deflect the PWB complementary to the deflection in the module.

4. An actuation apparatus for actuating an electrical connection of a land grid array module to a printed wiring board (PWB), comprising:

a plurality of load posts, the plurality of load posts connected to a backside stiffener situated below the printed wiring board;

a first springplate operably connected to the load posts, the first springplate having a hole;

a plurality of load columns, the plurality of load columns connected to a heatsink situated above the land grid array module;

a second springplate operably connected to the load columns; and a screw extending through the hole and operably connected to the first and second springplates for applying an actuation force to separate the first and second springplates a predefined distance, the screw including a stop to limit the actuation force imparted on the springplates, wherein a force resulting from operation of the actuation member is distributed to the load columns to move the heat sink downward toward the land grid array module, to move the backside stiffener upwards toward the printed wiring board, and to operably connect the land grid array module to the printed wiring board.

5. The apparatus of claim 4 wherein at least one of the first and second springplates are formed from a laminated material.

6. The apparatus of claim 5 wherein the PWB includes a front side and a backside thereof, the actuating the apparatus causes a deflection of the module, and the apparatus further comprises:

a backside stiffener operatively connected for applying force received the load posts to the backside of the PWB;

the backside stiffener including a pocket with a pedestal formed in the pocket, and a local stiffener positioned in the pocket between the pedestal and the backside of the PWB, the local stiffener operatively bearing against the backside of the PWB for causing a deflection in the PWB complementary to the deflection in the module when actuation force is applied by the apparatus.

7. The apparatus of claim 5 further comprises a backside stiffener operably attached to the load posts, the backside stiffener includes a local stiffener operably located on the backside stiffener.

8. A method for actuating an electrical connection of a land grid array module to a printed wiring board (PWB), the method comprising:

providing a heat sink operably connected to the land grid array module;

providing an actuation apparatus having a first and a second springplate, operatively connected for generating a force for operatively connecting the land grid array to the PWB, a screw operably connected to the first and second springplate and a stop for limiting rotation of the screw;

attaching the module to the pwb with the actuation apparatus;

rotating the screw operably connected to the first and second springplates;

translating rotation of the screw to a compressive force to operably connect the land grid array module to the printed wiring board; and limiting rotation of the screw with the stop to limit the compressive force.

9. A method of actuating the electrical connection of a land grid array module to a printed wiring board, comprising:

deflecting a land grid array module; and deflecting the printed wiring board complementary to the deflection of the module.

10. An apparatus for actuating an electrical connection of a land grid array module to a printed wiring board, comprising:

an actuation assembly to apply an actuation force;

a backside stiffener, the backside stiffener including a pocket with a pedestal formed in the pocket; and a local stiffener positioned in the pocket and contacting the pedestal;

wherein the local stiffener causes a deflection in the printed wiring board complementary to the deflection of the module when the actuation force is applied.

11. The apparatus of claim 10 wherein the pedestal formed in the pocket is centrally located within the pocket.

12. An actuation apparatus for actuating an electrical connection of a land grid array module to a printed wiring board (PWB), the apparatus comprising:

a plurality of load posts, the plurality of load posts connected to a backside stiffener situated below the printed wiring board;

a first springplate of laminated material operably connected to the load posts, the first springplate having a hole;

a plurality of load columns, the plurality of load columns connected to a heatsink situated above the land grid array module;

a second springplate of laminated material operably connected to the load columns; and an actuation member extending through the hole operably connected to the first and second springplates to separate the first and second springplates a predefined distance, whereby a force resulting from operation of the actuation member is distributed to the load columns to move the heat sink downward toward the land grid array module, to move the backside stiffener upwards toward the printed wiring board, and to operably connect the land grid array module to the printed wiring board.

13. An apparatus for actuating an electrical connection of a land grid array module to a printed wiring board (PWB), comprising:

a plurality of load posts;

a load plate operably connected to the load posts;

a plurality of load columns;

a springplate of laminated material operably connected to the load columns; and an actuation screw operably connected to the springplate, wherein a force resulting from the actuation screw is distributed to the load columns to operably connect the land grid array module to the printed wiring board.

14. The apparatus of claim 13 wherein the screw includes a stop to limit the actuation force imparted to the springplate.

15. The apparatus of claim 13 where in the PWB includes a front side and a backside thereof the actuating the apparatus causes a deflection of the module, and the apparatus further comprises:

a backside stiffener operatively connected for applying force received the load posts to the backside of the PWB;

the backside stiffener including a pocket with a pedestal formed in the pocket, and a local stiffener positioned in the pocket between the pedestal and the backside of the PWB, the local stiffener operatively bearing against the backside of the PWB for causing a deflection in the PWB complementary to the deflection in the module when actuation force is applied by the apparatus.

* * * * *